United States Patent [19]

Guéret

[11] 4,012,642
[45] Mar. 15, 1977

[54] JOSEPHSON JUNCTION LOGIC ELEMENT
[75] Inventor: Pierre Léopold Guéret, Thalwil, Switzerland
[73] Assignee: International Business Machines Corporation, Armonk, N.Y.
[22] Filed: June 9, 1975
[21] Appl. No.: 585,160

Related U.S. Application Data
[62] Division of Ser. No. 412,084, Nov. 2, 1973, Pat. No. 3,891,864.

[30] Foreign Application Priority Data
Nov. 17, 1972 Switzerland .................. 16755/72
[52] U.S. Cl. .............................. 307/212; 307/277; 307/306; 357/5
[51] Int. Cl.² ................. H03K 19/195; H03K 3/38
[58] Field of Search ................ 307/212, 277, 306; 357/5; 338/325; 340/173.1; 331/107

[56] References Cited
UNITED STATES PATENTS

| 3,564,351 | 2/1971 | McCumber | 307/306 X |
| 3,573,662 | 4/1971 | Fulton | 307/306 X |
| 3,758,795 | 9/1973 | Anacker et al. | 307/306 |

Primary Examiner—John Zazworsky
Attorney, Agent, or Firm—Thomas J. Kilgannon, Jr.

[57] ABSTRACT

Logic elements comprising resettable Josephson junctions cooperating with matched transmission lines have input circuit inductances connected to reversible Josephson devices which are so small that a flux of less than one flux quantum only can be trapped therein preventing the continued circulation of supercurrent in the inductance after removal of the input signals from the associated reversible Josephson junctions.

The resettable junctions are designed such that upon removal of the input or control field from the resettable Josephson junctions connected to the transmission line, the a.c. voltage which is generated across said junction, is larger than the time-average d.c. voltage across said junction when switched to its state of normal conductance so that, after removal of the input or control field from said junction, the d.c. voltage is caused to lock back to zero, thus resetting the element. Circuit parameters for achieving resettability without interrupting gate current are given. Logic circuits including AND, OR and NOT circuits are described and the conditions for the operation of such circuits which include both resettable and reversible Josephson devices are also given.

21 Claims, 11 Drawing Figures

JOSEPHSON JUNCTION LOGIC ELEMENT

This is a division, of application Ser. No. 412,084 filed Nov. 2, 1973, now U.S. Pat. No. 3,891,864, issued June 24, 1975.

BACKGROUND OF THE INVENTION

1. Field of the Invention

This invention relates to Josephson Junction devices which, upon removal of an input signal, reset themselves to a zero voltage state without interrupting the flow of gate current. It also relates to Josephson junction logic elements intended for performing logic functions at high speed. An example for the application of such logic elements is in data processing machines.

2. Description of the Prior Art

It has long been a requirement to reduce the time needed in switching operations and to increase the packing density of switching circuits so as to permit the execution of more switching operations in a certain time interval but with a yet smaller space occupied by the switching circuits. The present state of the art encompasses Josephson junction memory elements satisfying these requirements, and it is thus important to include logic circuits which can be manufactured in the same technology.

Switching circuits in Josephson junction technology so far proposed have the severe disadvantage of not being automatically resetting, thus requiring additional switches for their reset operation. While this would not pose a technical problem, the economics of any device incorporating the state of the art switching circuits must suffer considerably through long cycle times.

An example of a state of the art Josephson junction logic element is described in IBM Technical Disclosure Bulletin, Vol. 7, No. 3, August 1964, p. 271, by M. F. Merriam. A Josephson junction memory circuit is disclosed in Swiss patent 486.095. Further references of interest in connection with the invention hereafter to be described are two articles by D. E. McCumber, respectively published in the Journal of Applied Physics, Vol. 39, No. 6, May 1968, pp. 2503–8, and Vol. 39, No. 7, June 1968, pp. 3113–8, as well as the book, "Superconductive Tunneling and Applications," by L. Solymar, Chapman and Hall Ltd., London, 1972.

SUMMARY OF THE INVENTION

The present invention in its broadest aspect relates to Josephson junction logic elements having at least one input circuit for coupling at least one input signal to at least one Josephson junction and an output transmission line along which an output signal may be obtained, characterized in that the values of the parameters involved are chosen such that upon removal of the input signals the a.c. voltage generated across said junction when in its voltage state becomes larger than the time-average d.c. voltage across said junction so as to ensure automatic resetting of the junction to its zero voltage state after removal of the input signals.

In accordance with another broader aspect of the present invention, a Josephson junction circuit having at least a single resettable Josephson junction device therein and, control means electrically coupled to the device and operable during one time period to switch the device from a zero voltage to a voltage state and, during another time period, to reset the device from the voltage to the zero voltage stage is disclosed.

In accordance with the broader aspects of the present invention, the control means includes at least a single Josephson junction circuit having at least a single reversible Josephson device therein and at least a single signal means electrically coupled to the reversible Josephson device.

In accordance with more specific aspects of the invention an inductance is utilized which is connected to the reversible Josephson device which has a value such that the maximum flux trapped by said inductance is less than approximately one flux quantum. Where a plurality of reversible Josephson device are utilized in conjunction with an inductance, AND and OR logic circuits are provided. Also, by the proper arrangement of resettable and reversible Josephson devices a NOT circuit is provided.

In view of the requirements mentioned above and because of shortcomings of the prior art devices, it is an object of the present invention to propose self-resetting logic elements making use of the Josephson effect.

It is a further object of the invention to propose logic elements which are reversible in the sense that the circuits revert back to their original state after removal of the input signals.

The foregoing and other objects, features and advantages of the invention will be apparent from the following more particular description of a preferred embodiment of the invention as illustrated in the accompanying drawings.

DESCRIPTION OF PREFERRED EMBODIMENTS

The logic elements which are one of the subjects of the present invention employing Josephson junctions make use of two independent principles for controlling their behaviour. In order that these principles become more readily understandable and in order to provide one skilled in the art with data useful to the execution of the invention to be described, a brief consideration of prior art devices appears desirable.

Figure 1:
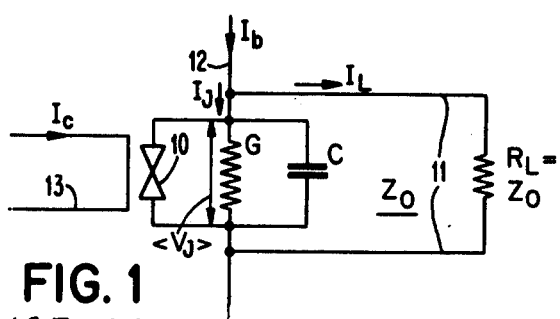
FIG. 1 is a block diagram of a state of the art Josephson junction logic element.

A terminated logic element consisting of a Josephson junction connected to a matched transmission line has already been proposed. Such an element is shown in FIG. 1 where 10 is a Josephson junction with its conductance G and capacitance C, shunted by a transmission line 11 having a characteristic impedance $Z_o$. The transmission line 11 is terminated by a resistance $R_L$ that matches the characteristic impedance $Z_o$. The parallel circuit of Josephson junction 10 and transmission line 11 is fed with a bias current $I_b$ on a line 12. Coupled to Josephson junction 10 is a control line 13 to which a control current $I_c$ may be applied. By proper design, control current $I_c$ controls the value of the maximum current $i_m$ through the Josephson junction by means of the magnetic field which it generates. This is explained by reference to the control gate characteristic of the Josephson junction in FIG. 2.

Figure 2:
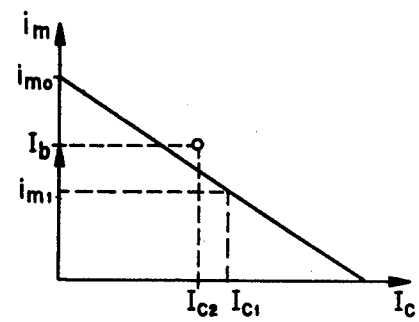
FIG. 2 is a diagram of the control gate characteristic of a Josephson junction.

FIG. 2 shows a typical example of the dependence of the maximum Josephson current $i_m$ on the control current, $I_c$. With $I_c = 0$, a certain value $i_{mo}$ can flow in the Josephson junction which is basically a function of the materials used and the dimensions of the junction. At current levels above $i_{mo}$, the Josephson junction will spontaneously switch from its zero voltage state to its voltage state. As the control current $I_c$ is increased, for example to the value $I_{c1}$, the maximum Josephson current before switching is reduced to $i_{m1}$.

In the superconducting state of the Josephson junction, all of the bias current $I_b$ is flowing in the junction ($I_b = I_J$) because the terminated transmission line 11 represents a resistive path. If now a control current $I_{c2}$ is applied, the Josephson junction will be switched to its voltage state, and a voltage drop $V_J$ occurs across the junction. Now the bias current $I_b$ will be split into a part $I_J < I_b$ continuing to flow through the Josephson junction and a part $I_L$ transferred into the load resistance $R_L$, with $I_L = V_J/R_L$.

Figure 3:
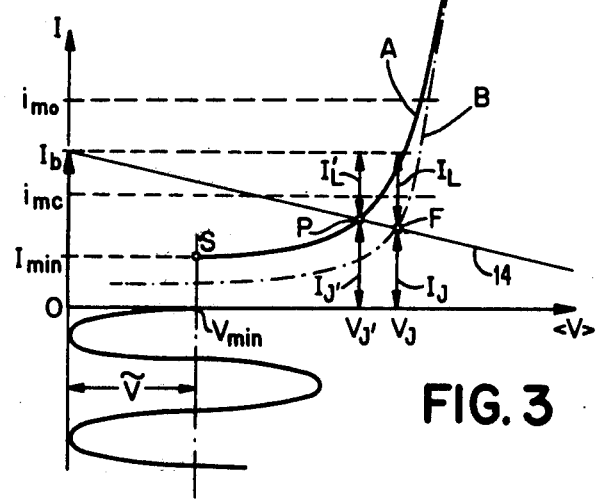
FIG. 3 is an I–V diagram.

The corresponding operating point is graphically obtained in FIG. 3 wherein curve A gives the characteristic of a Josephson junction with no control current $I_c$ applied. The maximum Josephson current is at $i_{mo}$, the bias current $I_b$ thus being lower than $i_{mo}$. Initially, all of this current flows through the Josephson junction. With a control current $I_c$ applied to control line 13 (FIG. 1), the maximum Josephson current is reduced from $i_{mo}$ to $i_{mc}$ and the characteristic is transferred from curve A to curve B. Now that the bias current $I_b$ is larger than the maximum current $i_{mc}$ admitted, the Josephson junction switches to its voltage state and assumes the operating point F at the intersection of the load line 14 with curve B. The current $I_b$ is now divided into a current $I_J$ continuing to flow through the Josephson junction and a current $I_L$ through the load resistance $R_L$. The voltage drop over the Josephson junction is $V_J$.

When the control current $I_c$ is afterwards removed, the characteristic B reverts back to curve A and the operating point moves from F to P. The position of P depends on $I_b$, $Z_o$ and the junction hysteresis characteristic through parameter $\beta_c = \omega_m C/G_o$, where $\omega_m = \pi\Delta/h$, $\Delta$ is the superconducting gap and $G_o$ is the normal conductance for voltages $> V_g$. As can be seen in FIG. 3, one ends up with currents $I_J'$ and $I_L'$ flowing respectively in the branches of the circuit, and a finite voltage $V_J'$ across the junction. The circuit obviously has not reset.

In order that the circuit be enabled to reset entirely, i.e., reverting to the initial condition of zero junction voltage with all of $I_b$ flowing through the junction, it is necessary to momentarily switch off the bias current $I_b$, thus allowing the junction voltage to lock back to its zero value. In other words, for resetting, the bias current $I_b$ has to be pulsed. This is a great disadvantage of the prior art devices because, if it is desired to stack a number of the circuits just described, it is mandatory to isolate them from one another by inserting large inductances in the common bias line so that switching occurring in one circuit does not affect any of the other circuits. If for reset the bias current $I_b$ would have to be switched off, all of the circuits on that line would be affected anyway and, it would take a very long time until the energy stored in the inductances vanishes.

By proper design, it is possible to obtain a self-resetting circuit without any need for pulsing the bias current $I_b$. This circuit makes use of the dynamic properties of the Josephson junction, namely of the fact that when there exists a finite static (time-average) d.c. voltage $<V_J>$ across the Josephson junction, an a.c. voltage $\tilde{V}$ of the frequency $f_J = 2e/h <V_J>$ appears which is superimposed on $<V_J>$ (a.c. Josephson effect). The amplitude of the a.c. voltage $\tilde{V}$ depends on the junction properties as well as on the load across it.

It is known that a Josephson junction which has been driven into the voltage state returns automatically to its zero voltage state once the total junction current $I_J$ becomes smaller than some minimum value $I_{min}$. This phenomenon is a dynamic one and is a direct consequence of the a.c. Josephson effect. It occurs actually when the instantaneous junction voltage $V_J = <V> + \tilde{V}$ crosses the line $V_J = 0$. The actual junction voltage $<V_J>$ for which this occurs is the minimum voltage $V_{min}$.

In order to obtain a self-resetting circuit, one has, therefore, to design the Josephson junction and the circuit parameters such that in the absence of input signals, the junction I-V characteristic and the load line have only one stable point in common, namely that on the zero voltage line.

In the circuit of FIG. 1 with $I_c = 0$, a finite average voltage $<V_J>$ gives a Josephson current $I_J = i_{mo} \sin \omega_J t$ where $\omega_J = 2\pi/h <V_J>$. This current which flows through the parallel combination of G, C and $Z_o$ gives rise to an a.c. voltage $\tilde{V}$ of an amplitude $\tilde{V}$ in accordance with:

$$|\tilde{V}| = \frac{R_e i_{mo}}{[1 + (R_e C \omega_J)^2]^{1/2}} \quad (1)$$

$$R_e = \frac{Z_o}{1 + Z_o G} \quad (2)$$

For automatic resetting, the junction current $I_J$ must be $<I_{min}$ as discussed above and written in equation (3) below:

$$I_J = \left[ I_b - \frac{V_{min}}{Z_o} \right] I_{min} \quad (3)$$

At the point S (FIG. 3) the amplitude $|\tilde{V}|$ of equation (1) is equal to $V_{min}$ and $<V_J>$ locks to zero. The criterion for self-resetting is obtained by using $$\frac{I_{min}}{i_{mo}} \approx \frac{G}{G_o} \sqrt{\frac{i_m/i_{mo}}{\beta_c}} + \frac{(\pi/4)^2}{2\beta_c} \left( \frac{i_m}{i_{mo}} \right)^2 \quad (4a)$$

$$X_{min} \equiv \frac{4}{\pi} \frac{V_{min}}{V_g} \approx \left( \frac{i_m/i_{mo}}{\beta_c} \right)^{1/2} \quad (4b)$$

$$\frac{I_b}{i_{mo}} < \frac{(\pi/4)^2}{2\beta_c} + \left( \frac{1 + GR_L}{G_o R_L} \right) \cdot \frac{1}{\sqrt{\beta_c}} \quad (4c)$$

where $G$ is essentially the actual junction conductance in the vicinity of $V_J = V_{min}$. For example, for a junction with an area of 2 μm × 2 μm and an oxide layer of 18 Å thickness having a relative dielectric constant $\epsilon_r = 4$, a capacity of $C = 0.078$ pF is obtained. With a maximum current density $J_{max} = 2 \cdot 10^4$ A/cm² the normal conductance $G_o$ (according to the BCS theory), is $10^7$ times the area of the junction, hence $G_o = 0.4$ Ω⁻¹. Calculating the superconducting energy gap $\Delta$ from $V_g = 2\Delta/e$. wherein $V_g$ is the gap voltage chosen to be $V_g = 2.5$ mV, $\Delta = 2 \cdot 10^{-22}$ Ws is obtained. With these values it is now possible to calculate the Josephson frequency at the gap $f_m = \pi\Delta/h$ which is found to be $f_m = 0.95 \cdot 10^{12}$ s⁻¹. This result permits the computation of the admittance ratio $\beta_c = \omega_m C/G_o$ and this is found to be $\beta_c = 1.16$.

Taking then $\beta_c = 1$ which corresponds to a maximum Josephson current density of $J_{max} = 2.3 \cdot 10^4$ A/cm², with $G/G_o = 0.2$, and for no control current $I_c$ applied, i.e., $i_m = i_{mo}$, equations (4a) and (4b) yield respectively $I_{min}/i_{mo} = 0.51$, and $V_{min} = 2$ mV. Equation (4c) yields then $(I_b/i_{mo}) < 0.76$ as the requirement for self-resetting with the data given above. Taking $(I_b/i_{mo}) = 0.7$, i.e., <0.57 in agreement with equation (5)

$$G_o Z_o \left(\frac{I_b}{i_{mo}}\right) > \frac{4}{\pi}(1 + Z_o G) \quad (5)$$

with $G_o Z_o = G_o R_L = 4$, which is the condition for $<V_J>$ to be in the vicinity of the gap voltage $V_g$, it is now possible to determine the relation between the transferred current $I_L$ in the load resistance $R_L$ and bias current $I_b$, using equation (6), $I_L/I_b = 0.45$.

$$\frac{I_L}{I_b} = \frac{4/\pi \cdot <V_J>/V_g}{(G_o Z_o)(I_b/i_{mo})} \simeq \frac{4/\pi}{(G_o Z_o)(I_b/i_{mo})} \quad (6)$$

$$0 > \frac{(\pi/4)^2}{2\beta_c}\left(\frac{i_m}{i_{mo}}\right)^2 + \frac{1}{\sqrt{\beta_c}}\left(\frac{1 + GR_L}{G_o R_L}\right)\left(\frac{i_m}{i_{mo}}\right)^{1/2}\left(\frac{I_b}{i_{mo}}\right) \quad (7)$$

With equation (7) one obtains $i_m/i_{mo} < 0.9$.

For the case with control current present ($I_c \neq 0$) such that $i_m/i_{mo} = 0.3$, we have $X_{min} = 0.55$ ($V_{min} = 1.1$ mV) with equation (4b), and $I_{min}/i_{mo} = 0.14$ with equation (4a).

With the above-made assumption of a current density of $J_{max} = 2.3 \cdot 10^4$ A/cm² the maximum Josephson current becomes $i_{mo} = 0.92$ mA, hence the bias current $I_b = 0.64$ mA. A circuit with the parameters as proposed above will be self-resetting after the removal of the control current $I_c$.

Figure 4:
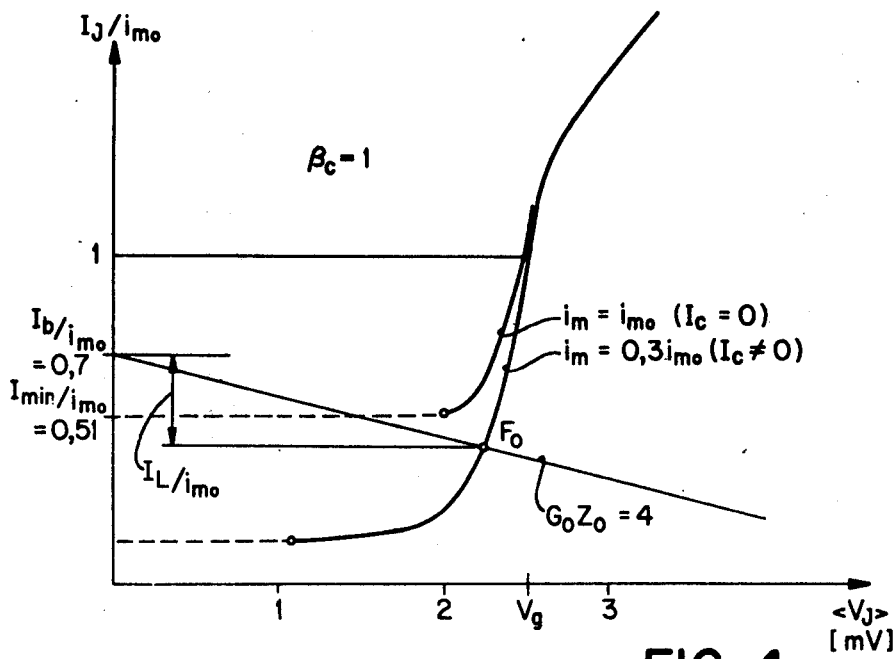
FIG. 4 is an I–V diagram for a specific output circuit for a logic element.

FIG. 4 shows the I-V characteristic of a Josephson junction using the data of the example given above.

It is of course important to choose the circuit parameters appropriately in view of the purpose which the circuit should serve. If the circuit were to be combined with others to perform some logic function, and the other circuits also contain Josephson junctions which are to be controlled, e.g., by the current $I_L$ transferred into the (terminated) line of the first circuit upon switching, that current $I_L$ must be of sufficiently large magnitude to cause switching of the further Josephson junctions. This naturally depends on the properties of the Josephson junctions involved.

A combination of this self-resetting circuit with another Josephson junction circuit which will be described results in a scheme for logic elements in accordance with the present invention. Consider now a circuit such as that of FIG. 5 in which the right branch is an inductance $L$. The current conditions and the phase $\phi$ across Josephson junction 15 are described by the equation $$I_{bo}/i_{mo} = (i_m/i_{mo})\sin\phi + \phi/\lambda,$$

wherein $i_{mo}$ is the maximum Josephson current for $I_c = 0$ and $\lambda = \omega_m L G_o = 2\pi N$, where $N$ is the maximum number of flux quanta $\phi_o$ which can be trapped in the inductance $L$.

Figure 5:
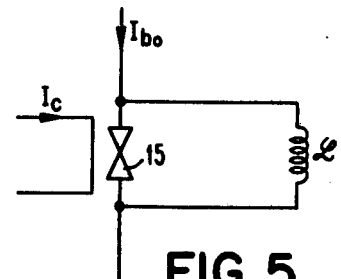
FIG. 5 is a block diagram of a Josephson junction element with an inductive loop.
Figure 6:
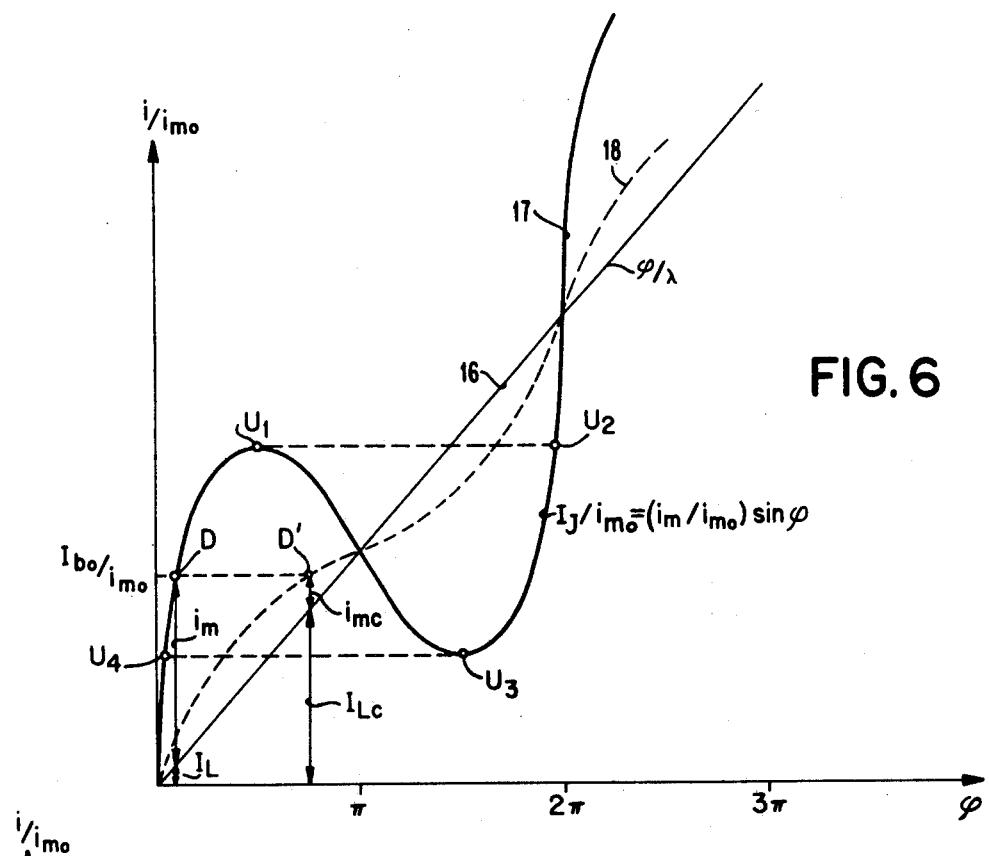
FIGS. 6 and 7 show the current transfer in an inductive loop.

The solution of the equation for the currents in the circuit of FIG. 5 can be obtained graphically as shown in FIG. 6. A straight line 16 represents that part of the current which is linear in $\phi$, i.e., the current $I_L/i_{mo} = \phi/\lambda$ flowing in the inductance, and a sine wave 17 superimposed on the straight line 16 represents the current $I_J = i_m \sin\phi$ in the Josephson junction. With a bias current $I_{bo}$ applied to the circuit of FIG. 5, an operating point D is obtained. At this point, a rather large part $i_m$ of the current $I_{bo}$ flows through junction 15, whereas only a small amount $I_L$ is allowed to pass through the inductance $L$.

As has been mentioned before, the application of an external magnetic field to the Josephson junction by means of a control current $I_c$ brings about a reduction of the maximum Josephson current $i_{mo}$. In connection with the circuit of FIG. 5, this fact is manifested by the dashed sine wave 18 in FIG. 6. Application of the control field, therefore, will result in the shifting of the operating point from D into D'. As can be seen from FIG. 6, the current relations have changed in that there is now a smaller current $i_{mc}$ flowing through the Josephson junction while more current is transferred to the inductance $L$ to yield the current $I_{Lc}$.

Figure 7:
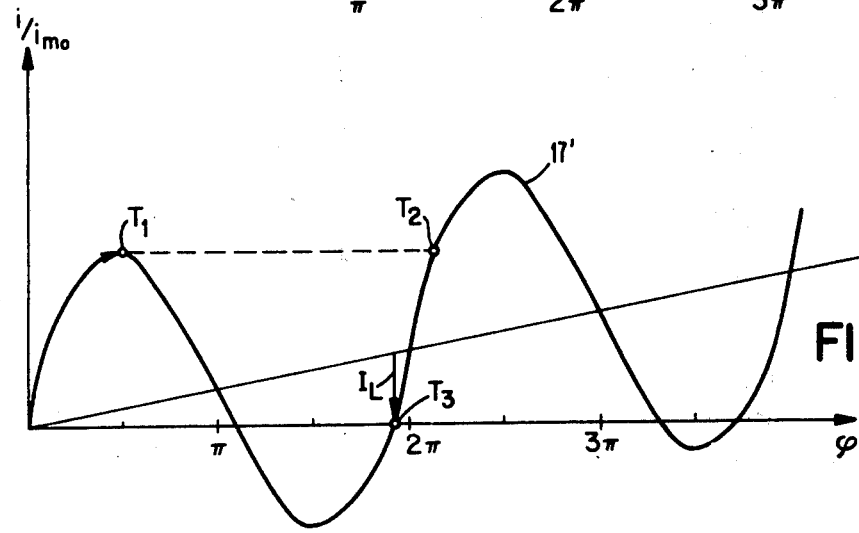

If the inductance $L$ is chosen small enough, the slope of the straight line 16 in FIG. 6 will be large so that the sine wave 17 superimposed thereon never crosses the $\phi$-axis. The determining factor is the value of $\lambda$. To avoid any crossings other than zero point, one must have $\lambda < 3\pi/2$. If, however, the inductance $L$ were large, the slope of line 16 would be small, and accordingly, the sine wave could have multiple intersections with the $\phi$-axis. This situation is shown in FIG. 7. If the current is initially increased, the operating point follows the sine wave 17' to point $T_1$ where the Josephson junction switches and a transfer to point $T_2$ occurs. If the current is then decreased, the operating point follows the sine wave 17' to point $T_3$ which is a stable point of operation. At this point, a current $I_L$ continues to circulate in the loop with zero current supplied from the outside. Actually, this case is the basis for a Josephson memory cell which, however, does not form part of the present invention.

In contrast, the present invention is devoted to a scheme where the inductance $L$ is small enough that except for the zero point there are no intersections of curve 17 with the $\phi$-axis. According to FIG. 6, this occurs providing $\lambda < 3\pi/2$. Since $\lambda = 2\pi N$, this is equivalent to $N < \frac{3}{4}$. In other words, the inductance must be small enough that the maximum flux $L\, i_{mo}$ is less than approximately one flux quantum $\phi_o$.

Under these conditions, no circulating current can possibly remain in the loop when the external sources are removed. This can be seen in FIG. 6 where initially increasing the current will lead to point $U_1$ where the junction switches to point $U_2$, from which the sine wave 17 is followed to point $U_3$, from where the junction switches back to point $U_4$ to return to zero point.

Returning now to the conditions earlier mentioned in connection with FIG. 6, i.e., with a control current $I_c$ applied, and with a bias current $I_{bo}$ flowing into the circuit, operating point $D'$ is assumed. A larger current is now flowing in the inductance $L$, whereas a reduced current remains flowing in the Josephson junction. Since conditions are chosen so that no switching of the junction (15) occurs in this process, the operating point will return from $D'$ to $D$ upon removal of the external field generated by the current $I_c$, and the current distribution is again what it was originally. The current transfer process brought about by the external control current $I_c$ is thus fully reversible.

The flux $\phi_L$ in the loop of FIG. 5 containing the inductance L is given by $\phi_L = (6/2\pi)\,\phi_o$. It can be seen from FIG. 6 that the maximum "reversible" flux which can be trapped in the loop obtains for $\phi = \pi$ and is equal to $\phi_o/2$.

In case the circuit arrangement of which the circuit of FIG. 5 is only a part, requires an operation with larger values of $\phi_L$, it is necessary to start out with larger values for the bias current $I_{bo}$. In general, if one takes $2N\pi/\lambda < I_{bo}/i_{mo} < (2N+1)\pi/\lambda$, reversible current transfer can also be achieved by controlling $i_m$. The trapped flux $\phi_L$ varies then between $N\phi_o$ and $(N + \frac{1}{2})\phi_o$.

The two concepts of self-resetting circuits and of reversible current transfer described in the previous paragraphs are used in what follows to realize various elements for performing certain logic functions, such as AND, OR, NOT. With these concepts realized in their design, all of these elements always revert automatically to their initial state once their input signals are removed. Under these circumstances, the operating conditions are unique and well defined. Moreover, there is no need for pulsing the bias sources, allowing, therefore, for shorter cycle times.

Figure 8:
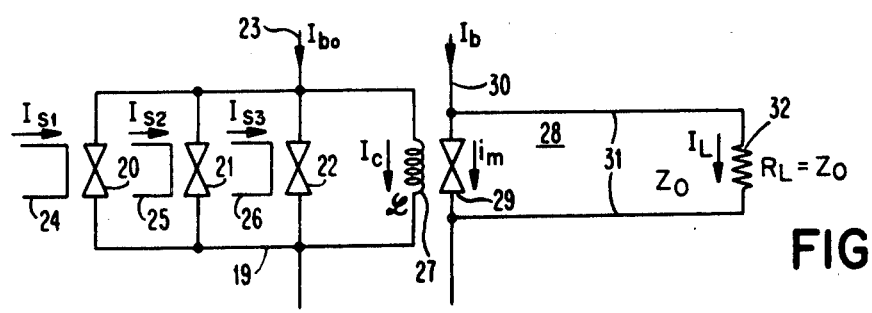
FIG. 8 is a circuit diagram of an AND gate.

FIG. 8 shows an example for a three-input AND gate in accordance with the present invention. This AND gate consists of an input circuit 19 comprising the Josephson junctions 20 through 22 in parallel connection which are supplied by a common bias line 23 to which the bias current $I_{bo}$ is applied. Josephson junctions 20 through 22 can be controlled by applying appropriate currents $I_{s1}$ through $I_{s3}$ to their respective control lines 24 through 26. Also in parallel connection with Josephson junctions 20 through 22 is an inductance 27.

The AND gate also comprises an output circuit 28 having a Josephson junction 29 connected to a bias line 30 and a transmission line 31 with a characteristic impedance $Z_o$. Transmission line 31 is terminated by a load resistance 32 of the value $R_L = Z_o$.

This AND gate is designed such that an output current $I_L$ is obtained only if all of the input currents $I_{s1}$ through $I_{s3}$ are present. The AND gate will automatically reset (with $I_L = 0$) if at least one of the input currents $I_{s1}$, $I_{s2}$ or $I_{s3}$ is removed.

With the three input currents $I_{s1}$ through $I_{s3}$ present, most of the bias current $I_{bo}$ is transferred into inductance 27 as control current $I_c$. The magnetic field generated by this control current $I_c$ will reduce the maximum Josephson current $i_m$ of the neighboring Josephson junction 29 below the value of the bias current $I_b$ applied to output circuit 28 provided control current $I_c$ is sufficiently large.

Since the maximum flux $\phi$ in inductance 27 is $\phi_o/2$ if complete reversibility is required, it follows that the bias current $I_b$ and the gate characteristic of output circuit 28 must be chosen such that junction 29 switches when a control flux $\phi_c$ of the order of $\phi_o/2$ is applied. For a gate characteristic as given by equation (8a)

$$\frac{i_m}{i_{mo}} = \frac{\sin \pi \phi_c/\phi_o}{\pi \phi_c/\phi_o} \qquad (8a)$$

and with the condition $i_m < I_b$, the condition $I_b/i_{mo} > 0.64$ is obtained for switching junction 29 in the presence of all of the input currents $I_{s1}$ through $I_{s3}$.

On the other hand, no switching should occur if only (n-1) of the n inputs of input circuit 19 are energized. Again using equation (8a) and FIG. 6, this additional requirement leads approximately to $I_b/i_{mo} < 0.9$. The conditions for $I_b$ are summarized in equation (10)

$$0.64 < \frac{I_b}{i_{mo}} < 0.9 \qquad (10)$$

The condition for self-resetting is given in equation (4c). The conditions for the input circuit 19 are summarized in equations (9a) and (9b).

$$0 < \frac{I_{bo}}{i_{mo}} < \frac{\pi}{\lambda} \quad (N=0) \qquad (9a)$$

$$\lambda < \frac{3\pi}{2} \qquad (9b)$$

Equation (9a) refers to the fundamental mode (N=0). For a practical embodiment of an AND gate one starts with the determination of the parameters for the output circuit 28. The values $J_{max} = 2.3 \cdot 10^4$ A/cm$^2$, A = 4 $\mu$m$^2$, $G_o = 0.47$ $\Omega^{-1}$, $Z_o = 4.2$ $\Omega$ ($G_o Z_o = 2$), $G/G_o = 0.2$ and $\beta_c = 1$ with equation (4c) give $I_b/i_{mo} < 1.0$ as condition for self-resetting. With equation (10) the limits are $0.64 < I_b/i_{mo} < 0.9$. If one chooses $I_b/i_{mo} = 0.8$, one obtains $I_L/I_b = 0.8$ with equation (6), and with equation (7) $i_m/i_{mo} < 0.8$.

It is now necessary to calculate the control current $I_c$ which is to flow in the inductance 27 of the input circuit 19. The value $i_m/i_{mo} < 0.8$ found for the output circuit implies with equation (8a) that $\phi_c/\phi_o > 0.36$. Using equation (8b)

$$\frac{\phi_c}{\phi_o} = \frac{1}{2\pi} \left(\frac{L}{\lambda_J}\right)^2 \left(\frac{I_c}{i_{mo}}\right) \qquad (8b)$$

in which L is the length of the Josephson junction and $\lambda_J$ is the Josephson penetration depth, one must have $$I_c/i_{mo} < 0.36 \cdot 2\pi/(L/\lambda_J)^2.$$

For a maximum Josephson current density $J_{max} = 2.3 \cdot 10^4 \text{A/cm}^2$, the Josephson penetration depth is $\lambda_J = 2.5$ μm. With a junction of a length of L = 2.5 μm and a width of 1.6 μm, corresponding to an area of A = 4 μm$^2$, one obtains $L/\lambda_J = 1$, so that $I_c/i_{mo} > 0.36 \cdot 2\pi 2.25$. The maximum Josephson current is calculated from $i_{mo} = J_{max} \cdot A = 2.3 \cdot 10^4 \text{A/cm}^2 \cdot 4 \cdot 10^{-8} \text{cm}^2 = 0.92$ mA, and thus $I_c > 2.05$ mA is found.

If it is now assumed that when all inputs 24 through 26 are energized, about 90% of the input bias current $I_{bo}$ is transferred into inductance 27, one must then have $I_c = 0.9 \cdot I_{bo}$ which gives $I_{bo} > 2.3$ mA. Taking then $\lambda = \pi$ to satisfy equation (9b), equation (9a) gives $I_{bo}/i_{mo} < 1$ for the input circuit, or $i_{mo} > I_{bo} = 2.3$ mA for the junctions in the input circuit. With $i_{mo} = J_{max} \cdot A$ and for $J_{max} = 2.3 \cdot 10^4$ A/cm$^2$, one finds $A > 10^{-7}$ cm$^2$, i.e., the area of the input junctions 20–22 should be larger than $10^{-7}$ cm$^2$ (for example = 3 μm × 4 μm).

Figure 9:
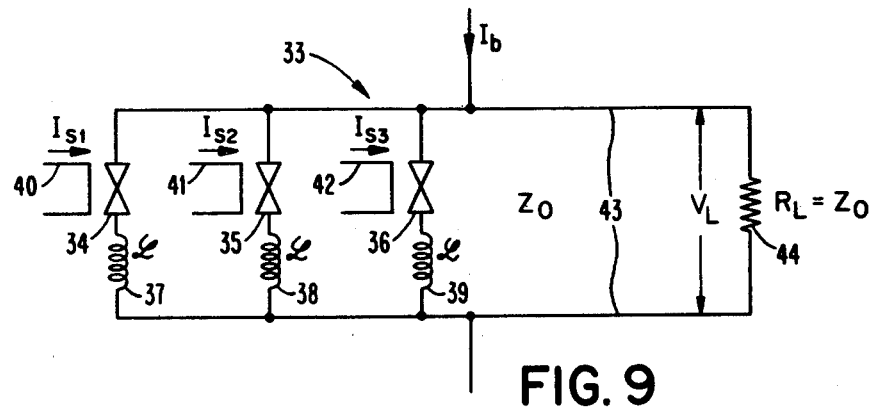
FIG. 9 is a circuit diagram of another AND gate.

Another way of implementing an AND gate is shown in FIG. 9. In this implementation input circuit 19 and output circuit 28 of the AND gate of FIG. 8 are combined to a common circuit 33 driven by a single bias current $I_b$. Josephson junctions 34 through 36 are respectively in series connection with inductances 34 through 39. Each of the junctions has its own control line 40 through 42, to which lines control currents $I_{s1}$ through $I_{s3}$ can be applied. The branches with Josephson junctions are in parallel connection and hooked to a transmission line 43 which is terminated by a resistance 44 whose value corresponds to the characteristic impedance $Z_o$ of line 43.

In operation, voltage $V_L = V_g$ is expected to appear across resistance 44 if all n inputs of the AND gate carry their input currents $I_s$, i.e., the Josephson junctions 34 through 36 must all have switched to their voltage state. If only (n-1) or less inputs are energized, no switching should occur, currents being transferred (in accordance with the same principle as described in connection with FIG. 6) into the non-energized branches.

These requirements lead to the condition $$n(i_m/i_{mo}) < (I_b/i_{mo}) < (n-1)(i_m/i_{mo}) + \pi/2\lambda,$$

where $\lambda = \omega_m \cdot LG_o = 2\pi N$. For complete reversibility, the inductances 37 through 39 have to be small enough that no loop current is allowed in the circuit after removal of all input signals. This implies $2\lambda < \pi/2$, i.e., the inductances must be so small as to be able to trap only a fraction of one flux quantum $\phi_o$.

Under these conditions, circuit 33 operates as a reversible AND gate. In addition, it is self-resetting if $(G_oZ_o)$ and $\beta_c$ are chosen small enough as required by equation (4c). In a preferred embodiment, the following parameters yield a reversible, self-resetting three-input AND gate:

$$I_b/i_{mo} = 1.1, \lambda = 2, (i_m/i_{mo})_{34...36} = 0.25, \beta_c 1, G_oZ_o = 5.$$

Figure 10:
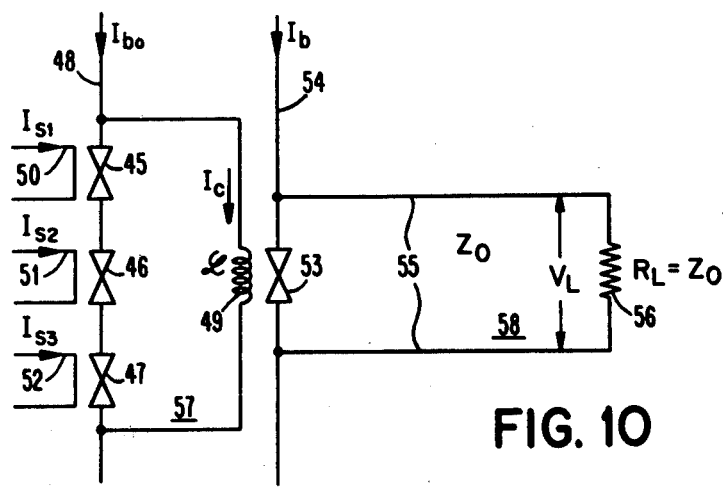
FIG. 10 is a circuit diagram of an OR gate.

An example of an OR gate using similar principles as the AND gate of FIG. 8 is shown in FIG. 10. In this example, three Josephson junctions 45 through 47 are in series connection with a bias line 48 and operate on a common inductance 49 which is connected in parallel to the junctions. Each of junctions 45 through 47 has its own input line 50 through 52, respectively. Inductance 49 is coupled to a Josephson junction 53 having its own bias line 54. As in the circuit of FIG. 8, junction 53 is connected to a transmission line 55 which is terminated with a resistance 56 of the value $R_L = Z_o$.

The OR gate will deliver an output signal (and a voltage $V_L = V_g$ across resistance 56) if any one or more of the input currents $I_{s1}$ through $I_{s3}$ are present. In this case, the respective Josephson junction 50, 51 or 52 is, for example, driven from an initial operating point at D in FIG. 6 to a new operating point at D', owing to the fact that the sine wave 17 for $I_J = i_{mo} \cdot \sin\phi$ has been flattened to the smaller sine wave 18 with $I_J = i_{mc} \cdot \sin\phi$. As can be seen from FIG. 6, at point D' a larger part of the bias current $I_{bo}$ has transferred into inductance 49. Care must be taken, however, that the application of the input currents $I_s$ to input lines 50 through 52 does not cause associated Josephson junctions to switch.

The application of one of the input current $I_s$ should result in an increased control current $I_c$ in inductance 49 of a magnitude sufficient to reduce the maximum Josephson current $i_m$ in junction 53 so that the latter switches to its voltage state, thus transferring part of the bias current $I_b$ into transmission line 55.

With these premises the operating conditions for an OR gate are as follows: The reversibility of the input circuit 57 is ensured if $I_{bo}/i_{mo} < \pi/\lambda$. Assuming a gate characteristic is in equation (8a), switching of junction 53 in output circuit 58 when one input current $I_s$ is applied, requires that $I_b/i_{mo} > 0.64$. Self-resetting of output circuit 58 is guaranteed, if equation (4c) is satisfied. One obvious advantage of the proposed OR gate is that, in spite of the input junctions 45 through 47 all being in series, the output current is always a constant $\simeq V_g/R_L$.

Figure 11:
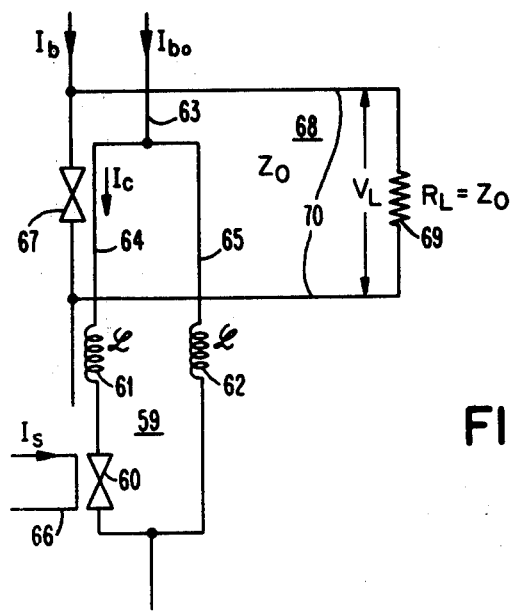
FIG. 11 is a circuit diagram of a NOT gate.

One possible implementation for a NOT gate is shown in FIG. 11. The NOT gate is to deliver an output signal (and a voltage drop $V_L$ across its output resistance $R_L$) if the input signal $I_s$ is not present. The NOT gate has an input circuit 59 comprising a Josephson junction 60 and two inductances 61 and 62 in parallel connection, one of them (61) being connected in series with junction 60. Bias current $I_{bo}$ is applied to a bias line 63 of input circuit 59 and is divided to flow in substantially equal parts through both branches 64 and 65 of input circuit 59. Josephson junction 60 has an input line 66 to which an input current $I_s$ can be applied.

With no input current $I_s$ present, bias current $I_{bo}$ is distributed between branches 64 and 65 as mentioned. The control flux $\phi_c \simeq L \cdot I_{bo}/2$ flowing in branch 64 which contains junction 60, is used to control a Josephson junction 67 of output circuit 68. Control flux $\phi_c$ is made large enough to keep junction 67 in its voltage state, thus producing a voltage $V_L$ across resistance 69.

If an input signal $I_s$ is applied, the maximum Josephson current of junction 60 is reduced and most of the current $I_c$ is transferred from branch 44 into branch 65. The transfer is reversible and occurs without switching of junction 60 in a way which has been described in connection with FIG. 6. The remainder of the flux $\phi_c$ does not then suffice to keep Josephson junction 67 in its switched state, and hence the output circuit 68 resets with $V_L = 0$.

The reversibility of this NOT gate is ensured if $$2 N\pi/\lambda < I_{bo}/i_{mo} < (2N + 1) \pi/\lambda,$$

with $\lambda$ being proportional to the inductance L.

With $N = 0$ (so-called fundamental mode) and a gate characteristic in accordance with equation (8a) assumed, one has $0 < I_{bo}/i_{mo} < \pi/\lambda$, and Josephson junction 67 of output circuit 68 switches if $I_b/i_{mo} > 0.9$.

For the case $N = 1$, input circuit 59 is operated with $2\pi/\lambda < (I_{bo}/i_{mo}) < 3\pi/\lambda$, and junction 67 will be in its voltage state (when $I_s = 0$) providing $I_b/i_{mo} > 0.35$.

It should be very clear to one skilled in the art to expand the principles of reversibility and self-resetting beyond the examples herein given to logic circuits performing other functions, without departing from the spirit of the invention.

What is claimed is:

1. A Josephson junction logic circuit comprising at least a pair of Josephson junction devices connected in parallel forming superconducting loops,
   a load shunting said devices,
   a source of current connected to said load and said devices, and
   means connected to each of said devices for suppressing circulating currents in said loops.

2. A Josephson junction logic circuit according to claim 1 further including means connected to each of said devices for reversibly transferring current to said load.

3. A Josephson junction logic circuit according to claim 1 wherein said load has a resistance value sufficient to reset said circuit.

4. A Josephson junction logic circuit according to claim 1 wherein said means for suppressing circulating currents includes an inductance disposed in series with each of said devices having a value of inductance which is capable of trapping only a fraction of one flux quantum.

5. A Josephson junction logic circuit according to claim 1 further including an output transmission line connecting said load to said devices said load having an impedance equal to the characteristic impedance of said transmission line.

6. A Josephson junction logic circuit according to claim 5 wherein said means for reversibly transferring includes a control line electromagnetically connected to each of said devices.

7. A Josephson junction logic circuit comprising
   at least a pair of Josephson junction devices connected in parallel having an initial current state,
   a load shunting said devices,
   means for applying current to said devices and said load, and,
   means connected in said circuit for eliminating loop currents during operation of said circuit.

8. A Josephson junction logic circuit according to claim 7 further including means electrically coupled to each of said devices for changing said devices from their initial current state when one less than all of said devices are actuated and for switching said devices to the voltage state when all of said devices are actuated.

9. A Josephson junction logic circuit according to claim 7 wherein said load has a resistance value sufficient to reset said circuit.

10. A Josephson junction logic circuit according to claim 7 wherein said means for eliminating loop currents includes an inductance disposed in series with each of said devices having a value of inductance which is capable of trapping only a fraction of one flux quantum.

11. A Josephson junction logic circuit according to claim 7 further including an output transmission line connecting said load to said devices said load having an impedance equal to the characteristic impedance of said transmission line.

12. A Josephson junction logic circuit according to claim 8 wherein said means for changing and for switching said devices includes a control line electromagnetically coupled to each of said devices.

13. A Josephson junction logic circuit comprising
   a source of current,
   at least n Josephson devices having a zero voltage and voltage state and having an initial current therethrough from said source connected in parallel and operable during at least first and second time periods and wherein n is at least 2,
   means operable during said first time period for actuating n-1 of said devices to change the initial current through said n-1 of said devices,
   means operable during said second time period for switching n said devices to said voltage state, and,
   load means connected in parallel with said n devices for receiving the current transferred thereto upon switching of said n devices to said voltage state.

14. A Josephson junction logic circuit according to claim 13 further including means connected to said means for switching and said means for actuating for returning n said devices to said initial state during a third time period.

15. A Josephson junction logic circuit according to claim 13 wherein said means for actuating $n-1$ of said devices includes a control line electrically coupled to each of said $n-1$ devices.

16. A Josephson junction logic circuit according to claim 13 wherein said means for switching n said devices to the voltage state include a control line electrically coupled to the nth of said devices.

17. A Josephson junction logic circuit according to claim 13 wherein said load has a resistance value sufficient to reset said circuit.

18. A Josephson junction logic circuit according to claim 13 further including an output transmission line connecting said load means to said devices said load means having an impedance equal to the characteristic impedance of said transmission line.

19. A Josephson junction logic circuit according to claim 14 further including means connected to each of said devices for eliminating circulating currents in said circuit during said first and third time periods.

20. A Josephson junction logic circuit according to claim 14 wherein said means for returning n said devices to said initial state includes an actuable current source the current value of which is reduced during said third time period to a value sufficient to return said devices to said initial state.

21. A Josephson junction logic circuit according to claim 15 wherein said means for eliminating circulating currents includes an inductance disposed in series with each of said n devices having a value of inductance which is capable of trapping only a fraction of one flux quantum.

* * * * *